United States Patent
Lill et al.

(10) Patent No.: US 6,632,321 B2
(45) Date of Patent: *Oct. 14, 2003

(54) METHOD AND APPARATUS FOR MONITORING AND CONTROLLING WAFER FABRICATION PROCESS

(75) Inventors: Thorsten Lill, Sunnyvale, CA (US); David Mui, Santa Clara, CA (US); Michael Grimbergen, Redwood City, CA (US)

(73) Assignee: Applied Materials, Inc, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,825

(22) Filed: Jan. 5, 1999

(65) Prior Publication Data

US 2003/0029834 A1 Feb. 13, 2003

Related U.S. Application Data

(60) Provisional application No. 60/070,574, filed on Jan. 6, 1998.

(51) Int. Cl.[7] ................................................. C23F 1/00
(52) U.S. Cl. ......................... 156/345.24; 156/345.26; 156/345.27; 156/345.28
(58) Field of Search ................. 156/345, 345.24–345.28

(56) References Cited

U.S. PATENT DOCUMENTS

| | | | |
|---|---|---|---|
| 4,208,240 A | 6/1980 | Latos | ..................... 156/627 |
| 4,367,044 A | 1/1983 | Booth, Jr. et al. | |
| 4,953,982 A | 9/1990 | Ebbing et al. | ............... 356/357 |
| 5,200,023 A | 4/1993 | Gifford et al. | |

(List continued on next page.)

FOREIGN PATENT DOCUMENTS

EP 0756318 A1 1/1997 ........... H01L/21/66

OTHER PUBLICATIONS

Heinrich, Friedhelm and Kopperschmidt, Pascal, "Online uniformity measurements in large area plasma assisted etching and deposition", Proceedings of the "10th Intern. Colloquium on Plasma Processes CIP '95", Antibes, France, Jun. 11–15, 1995.
Gottscho, et al., "Microscopic Uniformity in Plasma Etching," *J. Vac. Sci. Technol. B*, vol. 10, No. 5, Sep./Oct. 1992, pp. 2133–2147.
Jurgensen, et al., "The Effect of Mask Erosion on Process Latitudes in Bi–Layer Lithography," SPIE vol. 1262 *Advances in Resist Technology and Processing VII (1990)*, pp. 94–109.
Coburn, J.W. and Winters, H.F., "Conductance Considerations in the Reactive Ion Etching of High Aspect Ratio Features", Appl. Phys. Lett, pp. 2730–2732, 1989.
O'Hanlon, John F., "A User's Guide to Vacuum Technology", John Wiley & Sons, New York, 1989.
Dushman, Saul, "Scientific Foundations of Vacuum Technique", John Wiley & Sons, New York, 1962.

*Primary Examiner*—Jeffrie R. Lund
(74) *Attorney, Agent, or Firm*—Ashok K. Janah; Joseph Bach

(57) ABSTRACT

A method and apparatus for monitoring, measuring and/or controlling the etch rate in a dry etch semiconductor wafer processing system. The wafer processing system has a monitoring assembly which comprises an electromagnetic radiation source and detector which interferometrically measures the etch rate. The actual rate of change of the etch as it progresses is measures by this technique and is compared to a model of a desired rate of change in a controller. The error between the actual rate of change and the desired rate of change is then used to vary at least one of the process parameters of the system in a direction tending to null the difference.

21 Claims, 9 Drawing Sheets

U.S. PATENT DOCUMENTS

| | | | | |
|---|---|---|---|---|
| 5,337,144 | A | 8/1994 | Strul et al. | 356/357 |
| 5,362,356 | A | 11/1994 | Schoenborn | 156/626 |
| 5,372,673 | A | 12/1994 | Stager et al. | |
| 5,392,124 | A | 2/1995 | Barbee et al. | 356/381 |
| 5,450,205 | A | 9/1995 | Sawin et al. | 356/382 |
| 5,465,154 | A | 11/1995 | Levy | 356/382 |
| 5,587,038 | A * | 12/1996 | Cecchi et al. | 156/345 |
| 5,694,207 | A | 12/1997 | Hung et al. | 356/72 |
| 5,719,495 | A | 2/1998 | Moslehi | |
| 5,724,144 | A * | 3/1998 | Muller et al. | 356/382 |
| 5,795,493 | A * | 8/1998 | Bukhman et al. | 438/5 |
| 5,807,761 | A | 9/1998 | Coronel et al. | |
| 5,877,032 | A | 3/1999 | Guinn et al. | |
| 5,907,820 | A * | 5/1999 | Pan | 702/155 |
| 5,919,311 | A | 7/1999 | Shive et al. | 134/1 |
| 6,090,717 | A * | 7/2000 | Powell et al. | 438/710 |
| 6,159,297 | A * | 12/2000 | Herchen et al. | 118/708 |
| 6,390,019 | B1 * | 5/2002 | Grimbergen et al. | 118/723 R |
| 2003/0029834 | A1 * | 2/2003 | Lill et al. | 216/59 |

* cited by examiner

| run | SF$_6$ flow sccm | pressure mTorr | source power W | cathode temperature °C |
|---|---|---|---|---|
| a | 30 | 5 | 300 | 20 |
| b | 60 | 10 | 600 | 20 |
| c | 90 | 20 | 900 | 20 |
| d | 90 | 10 | 300 | 45 |
| e | 30 | 20 | 600 | 45 |
| f | 60 | 5 | 900 | 45 |
| g | 30 | 10 | 900 | 65 |
| h | 90 | 5 | 600 | 65 |
| i | 60 | 20 | 300 | 65 |

METHOD AND APPARATUS FOR MONITORING AND CONTROLLING WAFER FABRICATION PROCESS

This application claims the benefit of U.S. Provisional Application No. 60/070,574 filed Jan. 6, 1998, which is herein incorporated by reference.

BACKGROUND OF THE INVENTION

1. Field of the Invention

The present invention relates generally to semiconductor wafer processing systems, and more particularly, to method and apparatus for monitoring, processing and fabrication of such wafers using interferometric in situ measurement of the etch rate.

2. Description of Background

Integrated circuit wafer processing systems, particularly those which fabricate VLSI circuits on silicon wafers, can use many processes to form the circuit features on a wafer. One of the more prevalent processes is "dry etching" where a reactive gas in a plasma state is used to react with material on the wafer surface or an underlying substrate through a series of photoresist masks to produce the desired circuit features. Dry etching, also known as reactive ion etching (RIE), requires constant monitoring of the process to produce the desired results. Even relatively small uncontrolled changes in process parameters such the composition, pressure, flow rate or the ionization state of the etching gas, or the wafer temperature, electrode bias, etc. may cause unsatisfactory results.

When etching a three dimensional structure, conditions at the etch front change significantly during processing. The presence of sidewalls in the vicinity of the etching surface influences the influx of neutrals, ions and inhibitor precursors as well as the removal of reaction products causing changes in the etch rate. This effect is called aspect ratio dependent etch rate (ARDE) (also known as RIE lag), and as the name suggests the etch rate changes with the aspect ratio of a feature and not the etch depth. The aspect ratio of a feature is generally given by the ratio of the depth of the feature to the width of the feature.

The modality of ARDE is not fully understood and is a highly complex phenomenon. Various models have been proposed to explain the change in etch rate with increasing aspect ratio and differ mainly in which aspect of the etch mechanism, the ionic or the neutral component, is emphasized. Those studies which concentrate on the ionic component investigate such mechanisms as mask charging, ion shadowing, and localized surface charging giving rise to a significant ion flux to the sidewall. The ionic component etching may also be influenced by the power density loss at the bottom of the feature and the deposition of passivating layers at the bottom of the etched feature. This modality of etching is therefore very complex, hard to control and has some particularly detrimental effects to the etched feature including sidewall imperfections.

The influence of the neutral species on ARDE can be described by the easier to control effects of neutral shadowing and Knudsen transport. In a model proposed by Coburn and Winters in Applied Physics Letters 55 (1989) 2730, the neutral species effects on ARDE are described with the assumption that the etch rate is determined solely by the reaction of neutral etch species and the ionic component is neglected. Further, it is assumed that there is no etching of the sidewalls and the neutral species are reflected diffusely when colliding with the sidewall. Therefore, it would be highly desirable to control the ARDE of an integrated circuit etching process by the control of the neutral species effects of etching.

As feature size in modern integrated circuit fabrication continues to shrink, aspect ratios in general become larger and mask layers thinner. It is desirable to control the complex ARDE rate while fabricating an integrated circuit upon a semiconductor wafer.

Therefore, a need exists in the art for a method and apparatus for measuring and controlling the etch rate during the fabrication of integrated circuits that contain high aspect ratio features.

SUMMARY OF THE INVENTION

In one aspect of the invention, an apparatus for controlling a wafer processing system having a chamber and a pedestal within said chamber comprises an interferometer for generating a signal indicative of a rate of an aspect ratio dependent etch (ARDE) occurring within said chamber, and a controller coupled to said interferometer and said wafer processing system, for varying one or more process parameters of said wafer processing system in response to said signal, wherein the controller comprises an etch rate processing routine to control the rate of the aspect ratio dependent etch, the etch rate processing routine being capable of executing the steps of measuring an actual etch rate, determining a desired etch rate, comparing the actual etch rate to the desired etch rate, and varying one or more of the process parameters of the wafer processing system to change the actual aspect ratio dependent etch rate occurring in the chamber.

In another aspect of the invention, an apparatus for controlling a wafer processing system having a chamber comprising a pedestal to support a substrate for the etching of features on the substrate comprises an interferometer capable of generating a signal indicative of a rate of an aspect ratio dependent etch of the features being etched on the substrate, and a controller coupled to the interferometer and the wafer processing system, the controller being adapted to vary one or more process parameters of the wafer processing system in response to the signal, wherein the controller comprises an etch rate processing routine to control the rate of the aspect ratio dependent etch, the etch rate processing routine capable of executing the steps of measuring an actual etch rate, determining a desired etch rate, comparing the actual etch rate to said desired etch rate to determine an etch rate error, and varying one or more of the process parameters.

In another aspect, the invention provides a method and apparatus for monitoring, measuring and/or controlling the etch rate in a semiconductor wafer processing system. Specifically, a wafer professing system has a monitoring assembly which comprises an electromagnetic radiation source and detector which interferometrically measures the etch rate. The source, preferably a UV light source, is directed at a portion of the wafer surface where the etching is taking place. A portion of the UV light reflects back from the surface of the features of the wafer and another portion of the UV light reflects from the bottom of the features. There is a difference in phase between these two portions due to the extra distance of travel for the portion reflected from the bottom of the features. The difference in these phases forms an interference pattern which is more intense where the differently phased first and second portions of the light combine or interfere constructively and less intense where they cancel. The interference pattern is proportional or representative of the rate of change in the etch depth. The actual rate of change of the etch as it progresses is measured by this technique and is compared to a model of a desired rate of change in a controller. The error between the actual rate of change and the desired rate of change is then used to vary at least one of the process parameters of the system in a direction tending to null the difference. The actual rate of change is also an indicator of RIE lag (i.e., the change in etch rate that depends upon aspect ratios).

According to one aspect of the invention, the control of the parameters of the system is made to maintain the etch rate constant over the process. This will provide uniformity to the features particularly for a wafer with a high aspect ratio or with an ARDE feature.

According to another aspect of the invention, important process parameters such as etch gas flow, chamber pressure, source power and cathode temperature, either alone or in combination, can be used to control RIE lag.

These and other objects, aspects and features of the invention will be more clearly understood and better described when the following detailed description is read in conjunction with the attached drawings.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
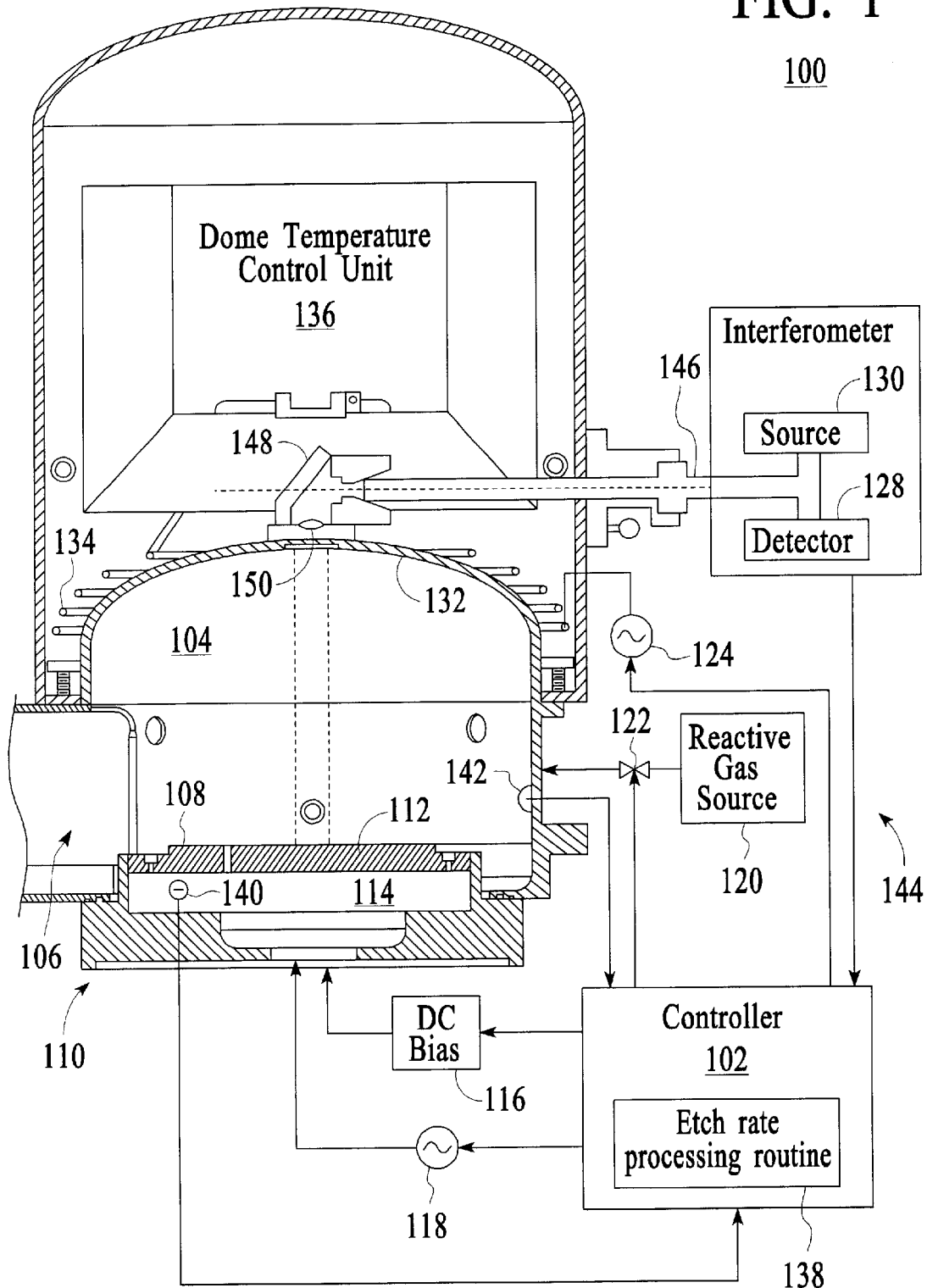
FIG. 1 is a cross-sectional schematic view of a wafer processing chamber that operates in accordance with the present invention.

FIG. 1 is cross-sectional side schematic view of an illustrative wafer processing system 100 that operates in accordance with the present invention. The wafer processing system 100 is particularly adapted to vacuum process workpieces, such as silicon wafers, for integrated circuits of the very large system integration (VLSI) type. Regulation of the dry etch chemical processes performed in the chamber, the sequence of those processes, and the transfer of the wafers to the chamber is controlled by a general purpose computer with associated memory, control circuitry and driver circuitry, and an operator interface in the form of a controller 102.

The wafer processing system 100 comprises a processing chamber 104 with an entry slit 106 (e.g., a slit valve) for the insertion and removal of a workpiece or substrate, for example, a silicon wafer 108. The chamber 104 houses a support pedestal 110 upon which the wafer is retained. The pedestal 110 generally comprises a chuck 112 (either electrostatic or mechanical) for physically retaining the wafer and a cathode 114 for supporting the chuck and biasing the wafer. An RF excitation source 118 (e.g., 13.56 MHz) is also electrically connected to the pedestal 110 which acts as a cathode. The cathode can be biased by a DC bias source 116 regulated by the controller 102 to influence the ion energy of the plasma gas in chamber 104. The ion energy ranges between 5 and 10 eV and is typically determined by the self bias of the plasma in contact with the wafer surface. Preferably, the plasma is a high density quasi remote fluorine plasma. The control of process gas flow, in the preferred example $SF_6$ via source 120, is provided by a flow control valve 122 under regulation of the controller 102. The $SF_6$ flow rate is typically in the range of 30 to 180 standard cubic centimeters per minute (sccm). The dome 132 enclosing the top of the process chamber 104 supports a set of coils (an antenna) which form an RF radiating element 134. The element 134 is coupled to an RF power source 124 (e.g., 13.56 MHz) also regulated by controller 102 for the purpose of ionizing the process gas in the chamber 104. The high density plasma may be sustained using the RF radiating element 134 only. The RF power applied to the radiating element 134 is typically between 50 and 900 Watts. Power may be applied to the cathode 114 for short periods of time (approximately 6 seconds) during breakthrough steps. The temperature of the cathode 114 is typically between 20 and 65° C. Additional heating of the chamber may be provided by infra-red heating elements located above the dome 132 within the dome temperature control unit (DTCU) 136.

The chamber 104 and associated processing equipment is preferably embodied by a Metal Etch Decoupled Plasma Source (DPS) chamber manufactured by Applied Materials of Santa Clara, Calif. A dome temperature control enclosure and apparatus of the Metal Etch DPS chamber is disclosed in U.S. patent application Ser. No. 08/767,071, filed Dec. 16, 1996 and is herein incorporated by reference. An etch depth measuring system of the Metal Etch DPS chamber is disclosed in U.S. patent application Ser. No. 08/944,240, filed Oct. 6, 1997 and is herein incorporated by reference.

The controller 102 receives feedback on the process parameters through a series of sensors and measurement devices including a temperature sensor 140 which provides a temperature signal to it indicative of cathode temperature, and a pressure sensor 142 which provides a pressure signal indicative of the chamber pressure. The wafer processing system 100 includes an etch rate measurement system 144 comprising a source 130 and detector 128 operating in conjunction with an etch rate processing routine 138 that is executed on a computer such as the controller 102. The source 130 is preferably a mercury lamp generating light in the UV range while the detector 128 is a photodiode or photomultiplier tube sensitive to UV radiation. The source light is guided through an optical fiber 146 onto a mirror 148. The source light is directed by the mirror 148 to the surface of the wafer 108 through a lens 150 which focuses it on a small portion of the surface. Preferably, the spot diameter is approximately 25 mm. in order to cover more than one die on the wafer surface. The source light is then reflected from the surface and refocused on the mirror 148 by lens 150. The reflected light passes back through optical fiber 146 to a filter in the detector 128. The filter allows light within a narrow band of wavelengths ($\lambda$) to pass. For example a band pass filter that transmits a narrow band centered on $\lambda$=254 nm with a full width at half maximum (FWHM) of 2 nm may be used. The light transmitted by the filter is, thus, approximately monochromatic. Interference of the reflected light can therefore by readily observed at the detector 128. The interference is due to first and second portions of the reflected light being out of phase because of the difference in travel time due to one part reflecting off the top of a feature (trench) on the wafer and the other part reflecting off the bottom of a feature. The detector 128 senses the filtered reflected light and transduces it into an electrical signal.

Figure 2:
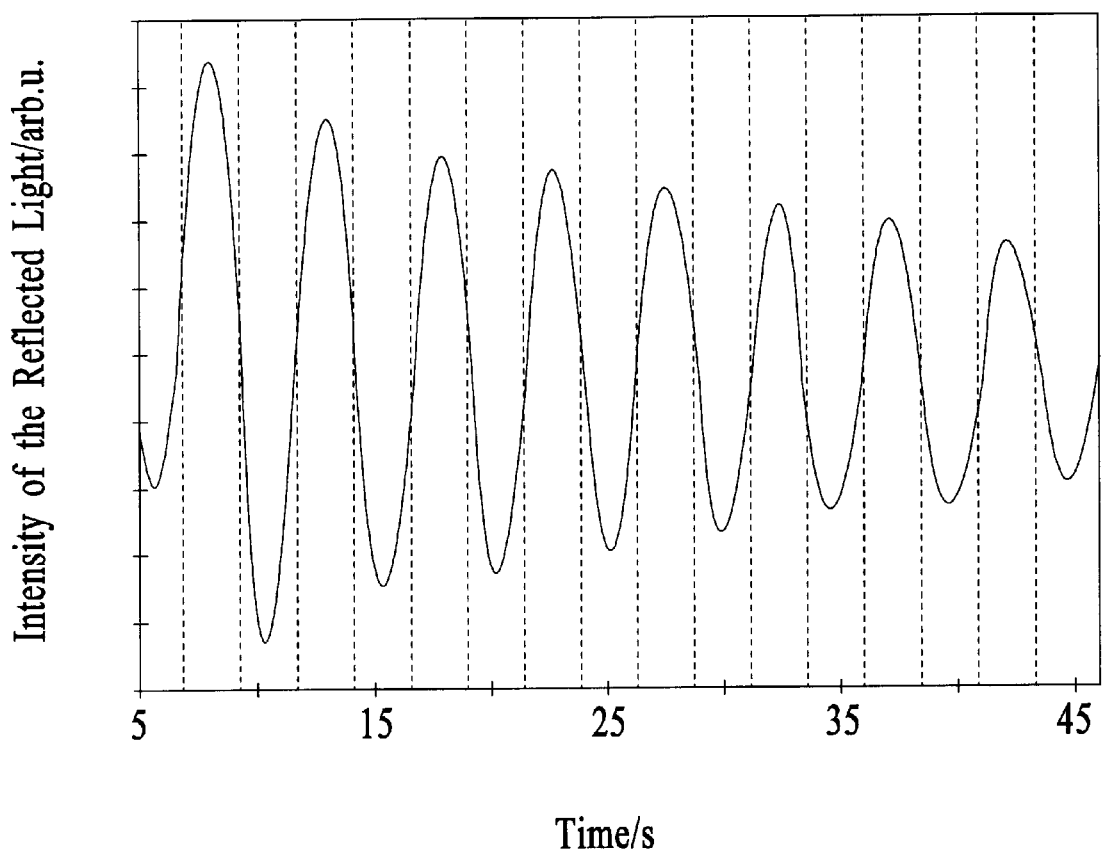
FIG. 2 is a graphical representation of intensity as a function of time for an interference pattern produced by the etch rate measurement system illustrated in FIG. 1.

The interference signal sent to the controller 102 is more fully shown in FIG. 2. It can be readily shown that the depth change in a feature (trench) that corresponds between two maxima, or two minima, is $\lambda/2$ (or 127 nm when $\lambda$=254 nm). Therefore, measuring the elapsed time between two depths, (i.e., the time between two conjugate points, i.e. two maxima or two minima, points on the waveform of FIG. 2) allows for the calculation of the average etch rate between the two points. When calculating the etch rate for all pairs of extrema (minima and maxima), the etch rate change as a function of time for etching deeper into the structure can be determined. As the depth of the trench increases, the etch rate generally decreases. It is noted from the interference signal that normally for constant process parameters, the time between extrema increases, indicating a decreasing etch rate with increasing etch depth. The rate of change in the frequency indicates the rate of change of the etch rate. Although normally the frequency decreases with etch depth, ARDE may cause other variations in etch rate due to an aspect ratio change as the etch progresses. For example, in inverse RIE (inverse ARDE) etch rate increases with increasing depth.

Figure 3:
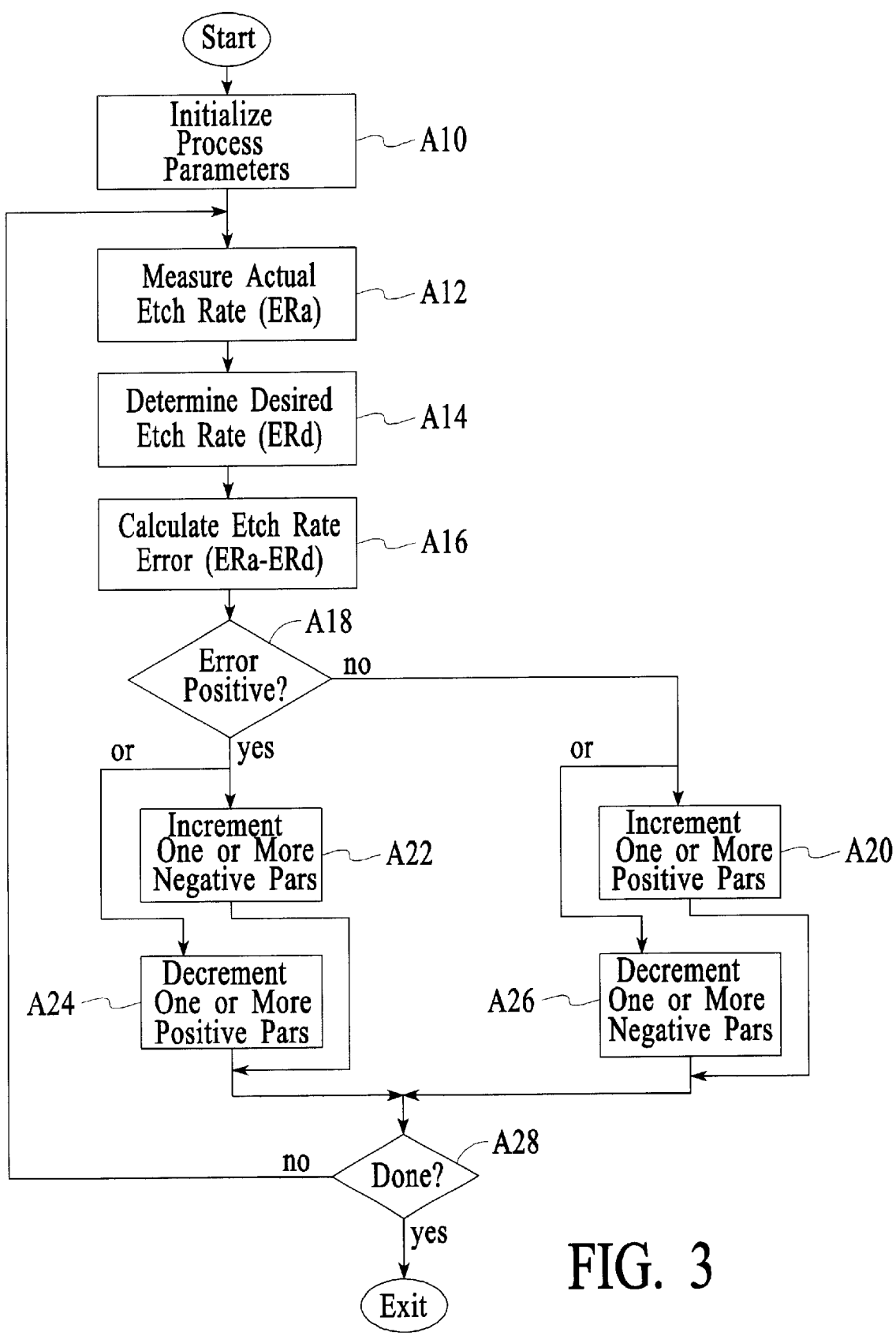
FIG. 3 is a pictorial system flow diagram of the etch rate processing routine of the controller illustrated in FIG. 1.

FIG. 3 is a flow diagram of the process of controlling etch rate for the system illustrated in FIG. 1 where in block A10 the process parameters of the system are initialized. The controller 102 brings the chamber up to processing temperature and pressure and controls the flow rate of processing gas into the chamber, the initial bias is set on the cathode 114 and the RF power supplies 118 and 120 controlled to initiate plasma conditions within the chamber 104. The etch rate measurement system 144 is then activated in block A12 to measure the actual etch rate for the process. Once the actual etch rate has been determined and stored, the controller 102 will determine from an etch rate profile for the particular process and the operating parameters, including time, temperature and process gas flow rate, the desired etch rate. The actual etch rate is compared in block A16 to the stored profile of the desired etch rate of the process and an error is calculated.

Alternatively, an average etch rate profile can be calculated from measured etch rate profiles for many wafers (e.g., several hundred) having a given set of process parameters and stored, for example, in the controller 102. The etch rate processing routine then processes subsequent wafers by comparing the stored profile of the average etch rate to the stored profile of the desired etch rate in block A16 to calculate the etch rate error.

The etch rate error is tested in block A18 for its sign, i.e., whether the actual etch rate of the process is too fast or too slow. For a too fast etch rate (sign positive) the program continues at block A22 and block A24 where one or more etch rate parameters which increase etch rate are decremented, or alternatively, one or more process parameters which decrease etch rate are incremented. For a too slow etch rate (sign negative) the program continues at block A20 and block A26 where one or more etch rate parameters which increase etch rate are incremented, or alternatively, one or more process parameters which decrease etch rate are decremented.

EXAMPLES A–I

To better understand the dependence of etch rate on the variance of the process parameters of the system illustrated in FIG. 1, a series of process runs a–i were made using differing values for the process parameters of process gas flow, chamber pressure, source power, and cathode temperature. The etch rate was measured in situ using the interferometric measurement system described. FIGS. 4–8 will now be more fully described to disclose the results of those test runs.

Figure 4:
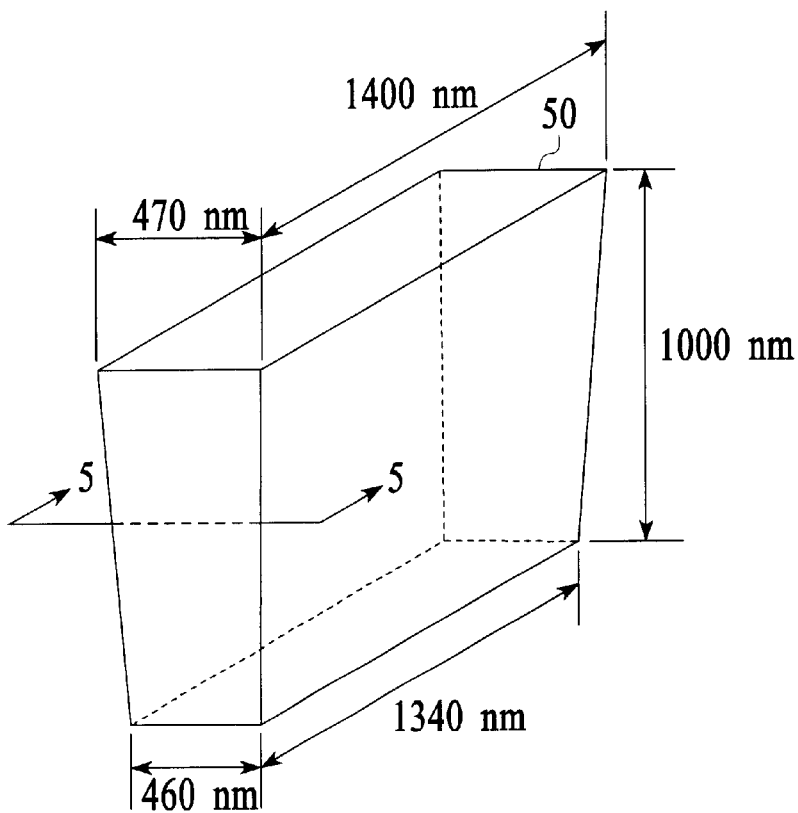
FIG. 4 is a pictorial representation of the geometry and aspect ratio of a feature used for a number of processing runs using the system illustrated in FIG. 1.

FIG. 4 pictorially illustrates the geometry of the features used in the test runs a–i after etching to a final depth of z=1000 nm. The features 50 are essentially holes in the shape of a pyramidal frustum having a rectangular cross-section that is reduced at larger depths z. This results in a reduction of the open area during the etch and has been taken into account in the data analysis. These features were chosen for their large aspect ratio which produces considerable ARDE, i.e., as the etch progresses the aspect ratio changes and causes a substantial change in etch rate.

Figure 5:
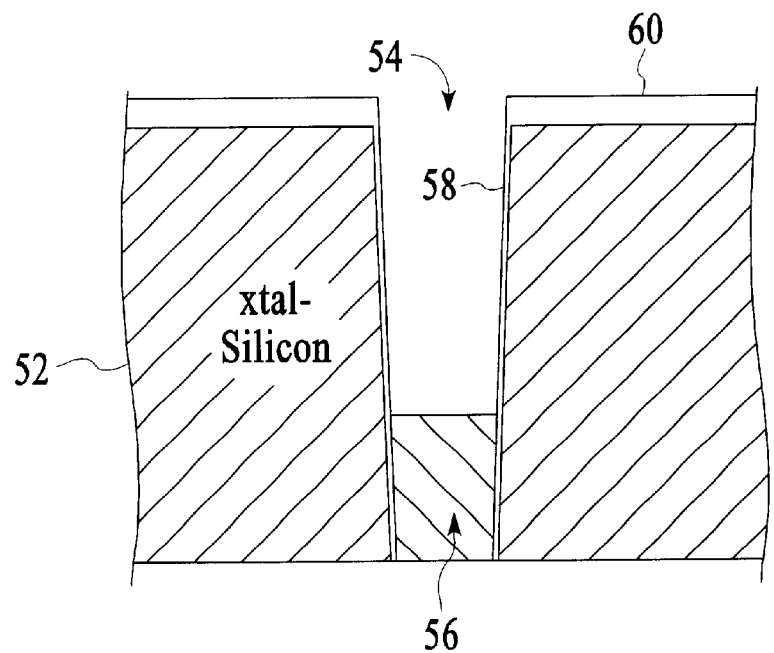
FIG. 5 is a cross-sectional side view taken along lines 5—5 of the feature illustrated in FIG. 4.

A cross-section of one of the features 50 is shown in FIG. 5. A silicon wafer 52 has been manufactured with a deep trench 54 filled with arsenic doped polysilicon 56. The trench 54 has thin side walls of oxynitride 58 and the top of the silicon 52 is covered by a nitride layer 60. This configuration was used to determine if etch rate and the wafer processing system could be improved for selective etching, i.e., it was desired that the etch process be very selective to the top nitride layer and the sidewall oxynitride. The tests achieved selectivities of 200:1 between polysilicon 56 in the trenches 54 and the top nitride layer 60 with $SF_6$ plasma and without power applied to the cathode, i.e., using antenna power only.

FIGS. 7a–7i illustrate normalized etch rates (instantaneous etch rate divided by starting etch rate for a flat wafer) as a function of the aspect ratio for nine different sets of process conditions. The values of the particular process parameters for each example is set forth in the table illustrated in FIG. 6. The slope of a least squares fit through the data points is a measure of the RIE lag effect. As can be seen in FIGS. 7a–7i, the RIE lag effect differs significantly for different process parameter values. Example c indicates an inverse RIE lag which, however, is not usually observed unless the etch process is accompanied by a deposition process, which is believed highly unlikely for the illustrated silicon etch with a fluorine chemistry. It is believed the inverse RIE lag in example c is an artifact and that the RIE lag for this example is more likely close to zero for this process run.

FIGS. 8a–8d show RIE lag (as given by the slopes of FIGS. 7a–7i) as a function of the four different process parameters of source power, chamber pressure, cathode temperature and process gas flow. The error bars in the figures illustrate the scatter of data points of FIGS. 7a–7i. These figures reveal that the chamber pressure and cathode temperature influence RIE lag strongly. For higher pressure (20 m Torr) and lower cathode temperature (20 deg C.), the RIE lag is reduced and close to zero when averaging the data points. It is believed that the strong influence of the chamber pressure and cathode temperature on RIE lag is predicted by the Knudsen transport model.

The Knudsen transport model divides the incoming flux of etch species (e.g., fluorine) on top of the structure $v_t$ into a first portion of neutrals that are reflected out of the feature without reaching the etch front $(1-K)v_t$, and a second portion that reaches the etch front but does not react $K(1-S)v_b$. Here, K is the transmission probability for the feature, S is the reaction probability and $v_b$ is the flux of etch species at the bottom of the feature. The incoming flux also includes a third portion, namely that portion of etch species which reaches the etch front and does react $Sv_b$. The transmission probability K is dependent on the geometry of the feature. The value of K for round pipes or slit like tubes can be found in standard vacuum technology references such as *A Users Guide to Vacuum Technology*, J. F. O'Hanlon; John Wiley & Sons, New York, 1989, pp. 36–37, or Scientific Foundations of Vacuum Technique, Second Edition, S. Dushman, J. M. Lafferty; John Wiley & Sons, New York, 1962, p. 94, both of which are incorporated herein by reference. The three portions balance according to the equation:

$$Sv_b=v_t-(1-K)v_t-K(1-S)v_b \quad \text{(eq. 1).}$$

The model assumes that the etch rate will be proportional to the flux of fluorine atoms (the ionic component is neglected). Therefore, the relative change of the etch rate for a certain aspect ratio z/d can be expressed as:

$$R(z/d)/R(0)=K/(K+S-KS) \quad \text{(eq. 2).}$$

Here z is the depth of the feature and d is the width. R(0) is, therefore, the etch rate at the bottom of a feature having either zero depth or infinite width and is proportional to $v_t$. R(z/d) is the etch rate at the bottom of a feature having depth z and width d and is proportional to $v_b$. The fit parameter in eq. 2 is the reaction probability S, which is generally unknown for the given etch conditions. If this parameter can be determined for given set of experimental conditions, a theoretical value of the normalized etch rate R(z/d)/R(0) can be determined from equation 2 for all values of z/d for those experimental conditions. A reaction probability S of 0.00168 has been reported for fluorine atoms at 23° C. with an undoped single crystal of silicon at a pressure range of several Torr (see D. L. Flamm, V. M. Donelly, J. A. Mucha; Journal of Applied Physics, 52 (1981) 3633 incorporated herein by reference).

Figures 6, 9:
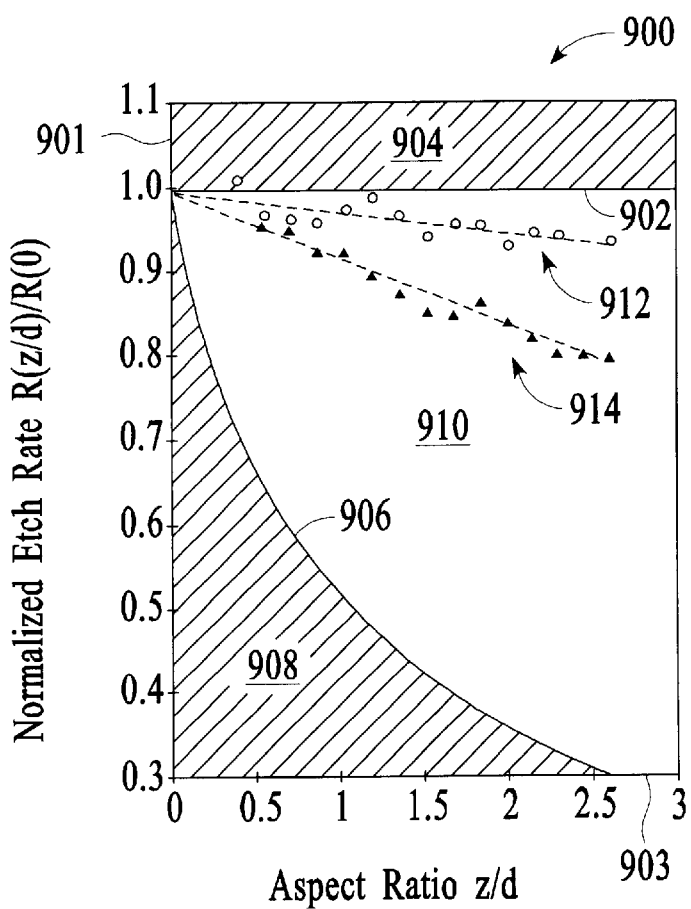
FIG. 6 is a tabular representation of a number of processing runs a–i for measuring RIE lag as a function of the various process parameters for the system illustrated in FIG. 1.
FIG. 9 is a graphical representation of normalized etch rate as a function of aspect ratio for theoretical and experimental conditions.
Figure 7A:
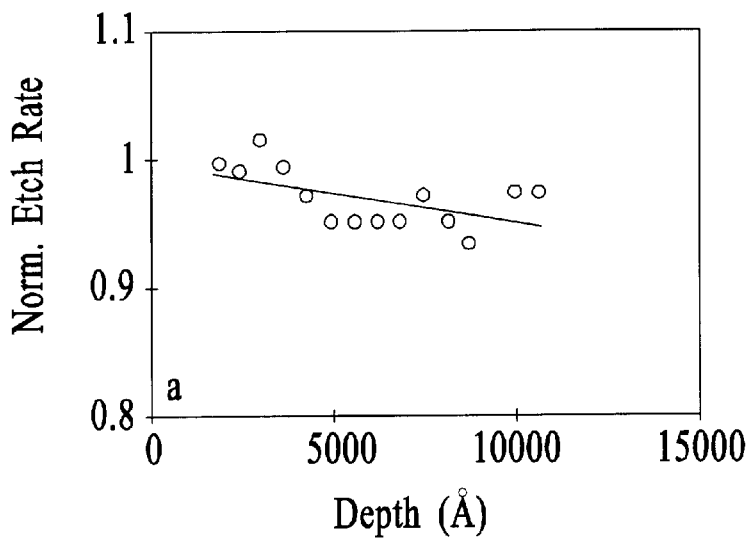
FIGS. 7a–7i are graphical representations of the measurement of the etch rate (normalized by starting etch rate) as a function of aspect ratio for the processing runs a–i illustrated in the table of FIG. 6.
Figure 7B:
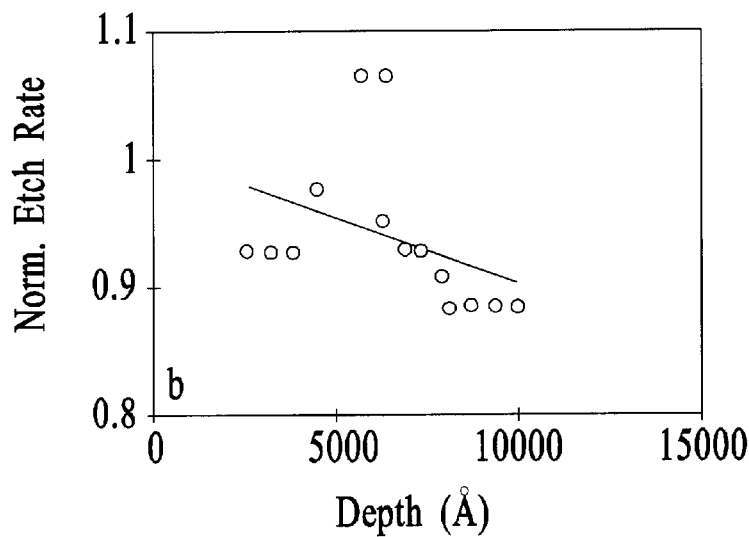
Figure 7C:
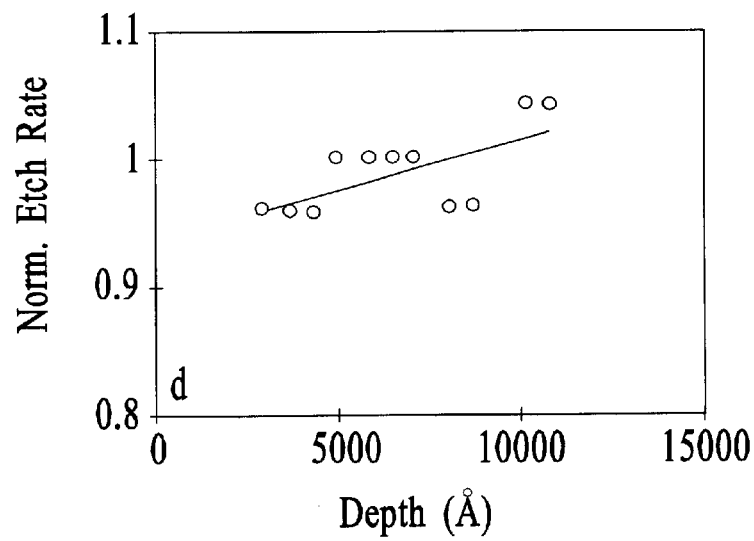
Figure 7D:
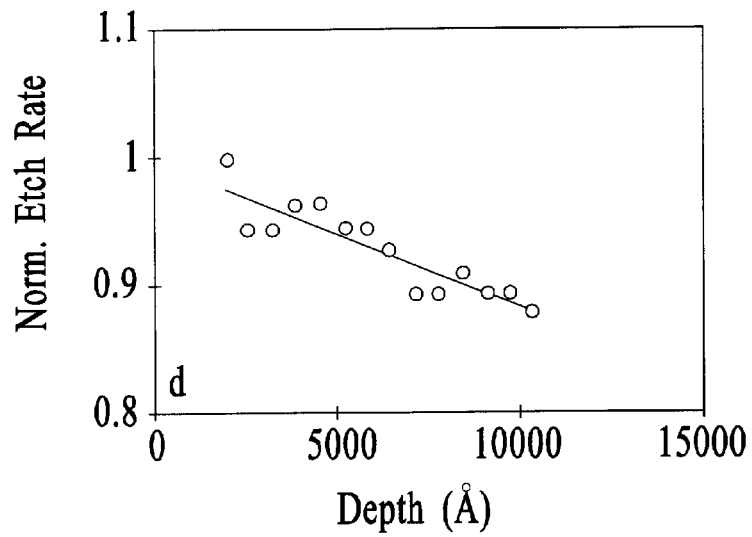
Figure 7E:
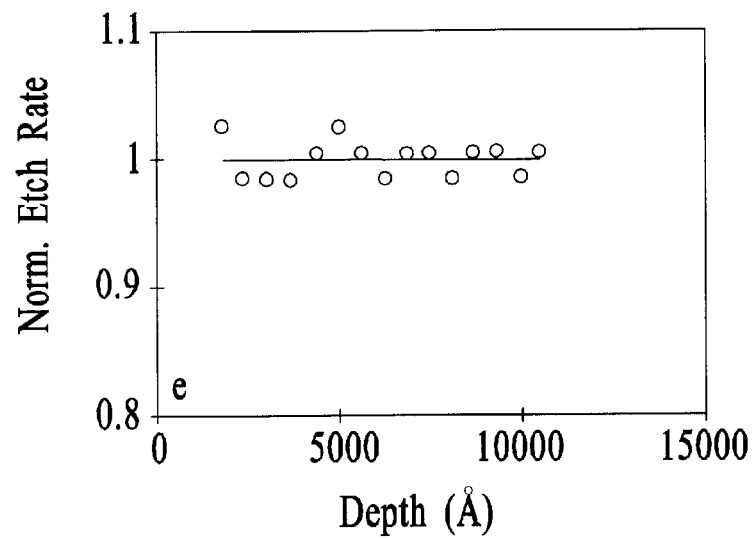
Figure 7F:
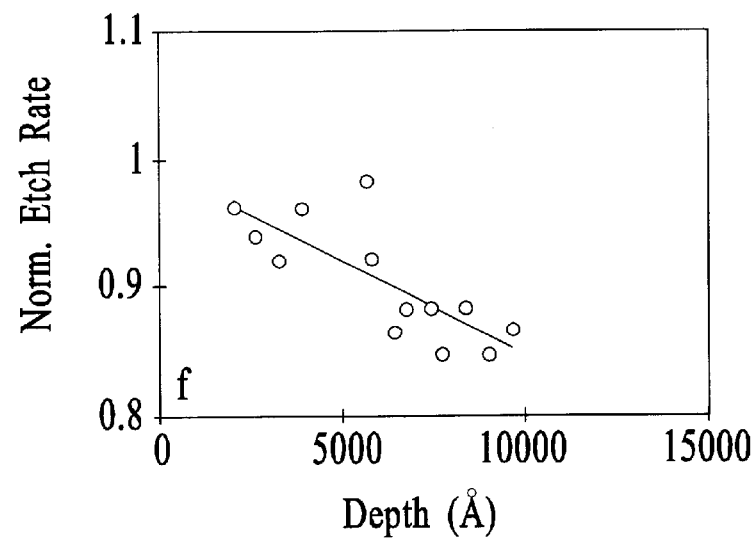
Figure 7G:
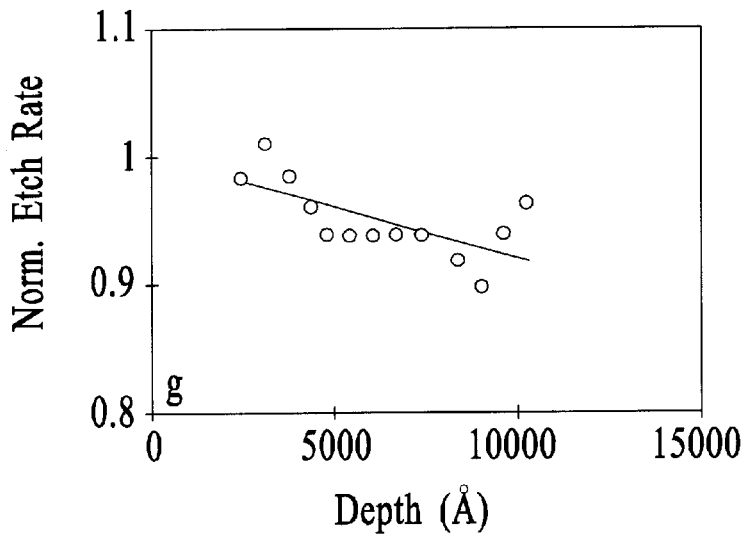
Figure 7H:
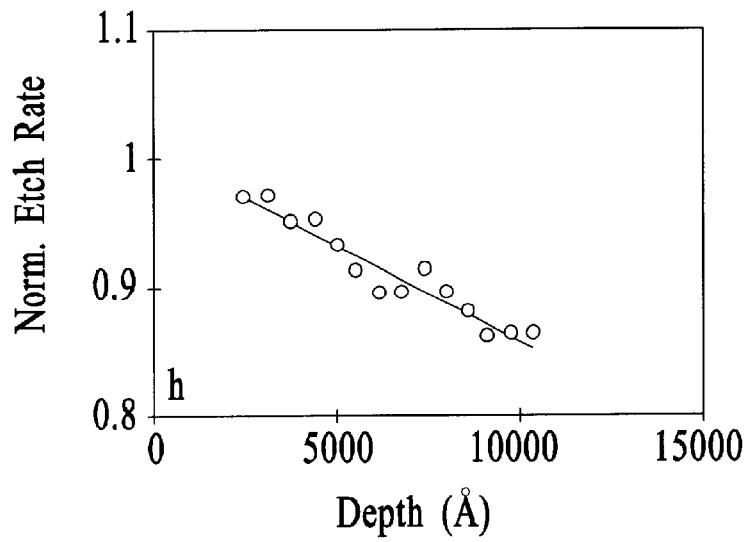
Figure 7I:
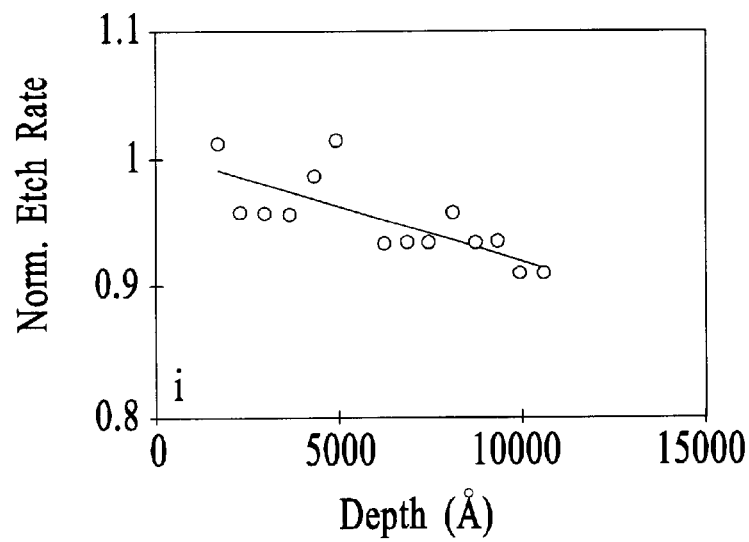
Figure 8A:
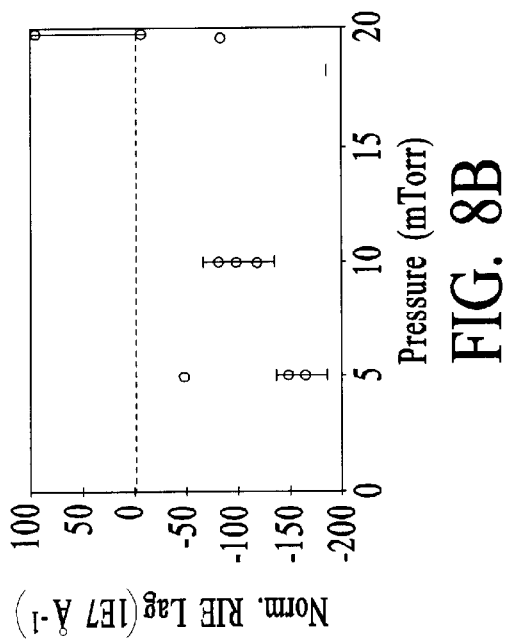
FIGS. 8a–8d are graphical representations of normalized RIE lag as a function of particular process parameters for the data of FIGS. 6 and 7.
Figure 8B:
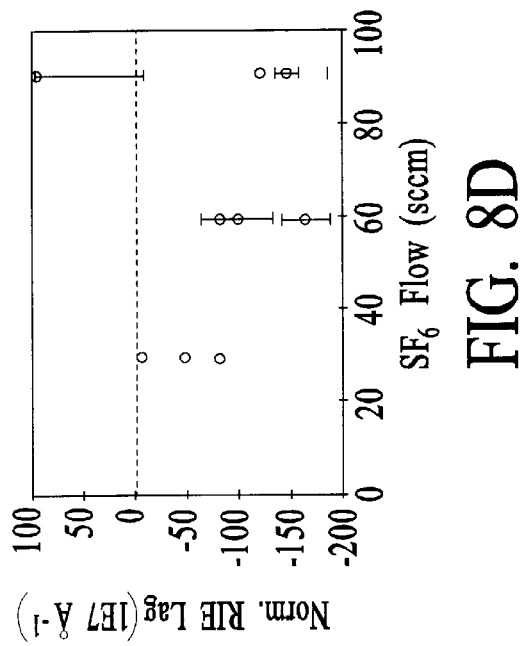
Figure 8C:
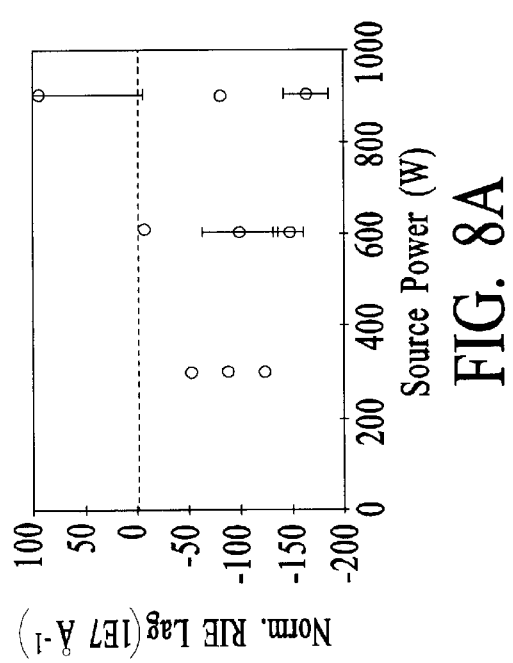
Figure 8D:
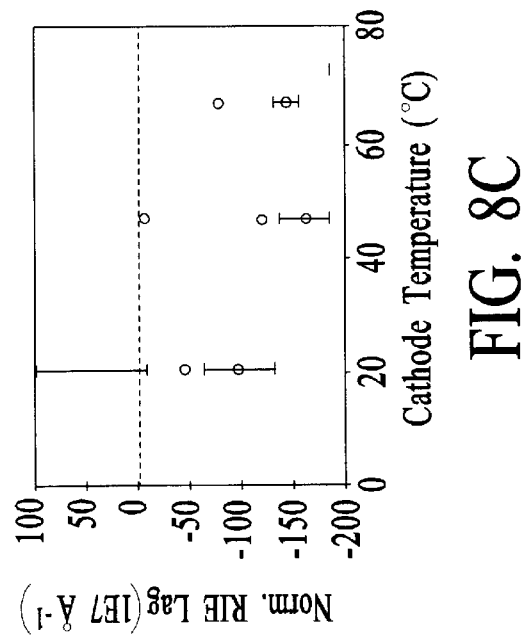

FIG. 9 shows a graph 900 of theoretical and experimental dependence of the normalized etch rate R(z/d)/R(0) on aspect ratio z/d using K values for a round tube. The normalized etch rate is plotted along a vertical axis 901 and aspect ratio is plotted along a horizontal axis 903. The theoretical dependence has an upper limit given by S=0.00168. An upper curve 902 bounds a first shaded region 904. The first shaded region 904 indicates values of the normalized etch rate that are larger than possible under the Knudsen transport model. Note that curve 902 indicates that almost no RIE lag would be present for a reaction probability of 0.00168. A lower curve 906 has been calculated for a reaction probability S=1, which is the upper limit for RIE lag due to the Knudsen effect. A stronger decline in etch rate with increasing aspect ratio than that indicated by a lower curve 906 cannot be explained solely by Knudsen transport. Thus a second shaded region 908 indicates values for the normalized etch rate that are too small to be possible under the Knudsen model. Acceptable values lie in an unshaded region 910 that lies between the upper and lower curves 902 and 906.

The circles 912 in FIG. 9 represent data points from experiment (e) and the triangles 914 represent data points from experiment (h). The data points lie substantially within the unshaded region 910. These data points can be fitted using eq. 2 resulting in reaction probabilities of 0.03 and 0.11 for experiments (e) and (h) respectively. In these fits the change in the open area of the feature due to the taper angle of the structures has been taken into account. Excluding experiment (c), which shows a reverse RIE lag, all other experimental runs gave reaction probabilities of between 0.03 and 0.11. Once a reaction probability has been established for a given set of experimental conditions, an expected etch rate can be calculated.

One consequence of the Knudsen model is that the RIE lag depends mainly on the reaction probability and, hence, on surface coverage. This is why a reduced RIE lag effect is observed for experiments at high pressure and/or lower cathode temperature. For these conditions, the surface coverage is larger and the transport of the neutrals is no longer a limiting factor.

The dependence of the RIE lag on process gas flow and source power are less clear. When averaging the data points for the same value of one of the parameters, either source power or process gas flow, only a weak dependence is obtained. Source power and process gas flow have, however, a strong impact on the silicon etch rate. Further, the RIE lag shows a strong correlation with the quotient of chamber pressure divided by cathode temperature, while the silicon etch rate shows a dependence on the product of the source power and process gas flow. The latter can be readily explained by the fact that the silicon etch rate is determined by the fluorine atom supply at the etch front. For high process gas flows and source powers, this effect levels out indicating a fluorine saturation at the etch front.

This data, and other similarly derived empirical information, can be used to formulate the desired etch rate schedule used in the closed loop control described for FIG. 1. Such schedules are then stored as functions or look up tables which the controller 102 uses to determine the desired etch rate for the process under consideration at the time. Different processes will use different parameters to advantage, with strongly influencing parameters such as process gas flow and cathode temperature being used for gross or overall control, or for fast correction, and secondary parameters perhaps being used for close tolerances and slower changes.

While the invention has been described in connection with a preferred embodiment, this specification is not intended to limit the scope of the invention to the particular forms set forth, but, on the contrary, it is intended to cover any such alternatives, modifications, and equivalents as may be included within the spirit and scope of the invention as defined by the appended claims.

What is claimed is:

1. Apparatus for controlling a wafer processing system having a chamber and a pedestal within said chamber, the apparatus comprising:

an interferometer for generating a signal indicative of a rate of an aspect ratio dependent etch (ARDE) occurring within said chamber; and a controller coupled to said interferometer and said wafer processing system, for varying one or more process parameters of said wafer processing system in response to said signal, wherein the controller comprises a memory and an etch rate processing routine to control the rate of the aspect ratio dependent etch, the etch rate processing routine being capable of executing the steps of:
retrieving a predetermined etch rate schedule from the memory of the controller, the predetermined etch rate schedule comprising a function of desired aspect ratio dependent etch rate over time;
mesuring an actual aspect ratio dependent etch rate by measuring the elapsed time between two conjugate maxima or minima points of the signal generated by the interferometer;
comparing the actual aspect ratio dependent etch rate to the desired aspect ratio dependent etch rate in the retrieved predetermined etch rate schedule; and
varying one or more of the process parameters of the wafer processing system to change the actual aspect ratio dependent etch rate occurring in the chamber to substantially follow the desired aspect ratio dependent etch rate.

2. The apparatus of claim 1 wherein said interferometer comprises:
an optical fiber, coupled between a light source, a lens coupled to the light source, and a detector.

3. The apparatus of claim 1 further comprising:
a pressure sensor coupled to said chamber and said controller for measuring a pressure within said chamber.

4. The apparatus of claim 1 further comprising a cathode and a temperature sensor coupled to said cathode and said controller.

5. The apparatus of claim 1 wherein the etch rate processing routine is capable of executing the step of:
comparing said actual aspect ratio dependent etch rate to said desired aspect ratio dependent etch rate to determine an etch rate error.

6. An apparatus according to claim 5 wherein the controller is adapted to either increment a process parameter which lowers the aspect ratio dependent etch rate or decrement a process parameter that increases the aspect ratio dependent etch rate when the actual aspect ratio dependent etch rate is greater than the desired aspect ratio dependent etch rate.

7. An apparatus according to claim 5 wherein the controller is adapted to either increment a process parameter which increases the aspect ratio dependent etch rate or decrement a process parameter that lowers the aspect ratio dependent etch rate when the actual aspect ratio dependent etch rate is less than the desired aspect ratio dependent etch rate.

8. The apparatus of claim 1 wherein the controller is adapted to vary a process parameter comprising an RF power supplied to a gas in the chamber, a flow rate of a gas flowing into the chamber, a pressure in the chamber, or a temperature in the chamber.

9. An apparatus according to claim 1 wherein the controller is adapted to vary the process parameters to maintain the aspect ratio dependent etch rate at a constant etch rate.

10. An apparatus for controlling a wafer processing system having a chamber comprising a pedestal to support a substrate for the etching of features on the substrate, the apparatus comprising:
an interferometer capable of generating a signal indicative of an etch rate that is dependent upon an aspect ratio of a feature being etched on the substrate; and
a controller coupled to the interferometer and the wafer processing system, the controller being adapted to vary one or more process pararmeters of the wafer processing system in response to the signal, the process parameters comprising one or more of an RF power supplied to a gas in the chamber, a flow rate of a gas flowing into the chamber, a pressure in the chamber, and a temperature in the chamber, wherein the controller comprises a memory and an etch rate processing routine to control the etch rate, the etch rate processing routine being capable of executing the steps of:
retrieving a predetermined etch rate schedule from the memory of the controller, the predetermined etch rate schedule comprising a function of desired aspect ratio dependent etch rate over time;
measuring an actual aspect ratio dependent etch rate by measuring the elapsed time between two conjugate maxima or minima points of the signal generated by the interferometer;
comparing the actual aspect ratio dependent etch rate to the desired aspect ratio dependent etch rate in the retrieved predetermined etch rate schedule; and
varying one or more of the process parameters to change the actual aspect ratio dependent etch rate to substantially follow the desired aspect ratio dependent etch rate.

11. The apparatus of claim 10 wherein the interferometer comprises:
an optical fiber coupled between a light source, a lens coupled to the light source, and a detector.

12. The apparatus of claim 10 wherein the etch rate processing routine is capable of executing the step of:
comparing the actual aspect ratio dependent etch rate to a desired aspect ratio dependent etch rate to determine an etch rate error.

13. An apparatus according to claim 12 wherein the controller is adapted to either increment a process parameter which lowers the aspect ratio dependent etch rate or decrement a process parameter that increases the aspect ratio dependent etch rate when the actual aspect ratio dependent etch rate is greater than the desired aspect ratio dependent etch rate.

14. An apparatus according to claim 12 wherein the controller is adapted to either increment a process parameter which increases the aspect ratio dependent etch rate or decrement a process parameter that lowers the aspect ratio dependent etch rate when the actual aspect ratio dependent etch rate is less than the desired aspect ratio dependent etch rate.

15. An apparatus according to claim 10 wherein the controller is adapted to maintain aspect ratio dependent the etch rate at a constant etch rate.

16. A wafer processing system comprising the apparatus of claim 10.

17. An apparatus for etching a substrate, the apparatus comprising:
a chamber comprising a pedestal capable of supporting a substrate:
a reactive gas source for delivering a reactive gas to the chamber and an excitation source capable of energizing the reactive gas to etch the substrate;
an interferometer capable of generating a signal indicative of an actual aspect ratio dependent etch rate of the features being etched on the substrate; and
a controller coupled to the interferometer, the controller being adapted to vary one or more process parameters in response to the signal, wherein the controller comprises a memory and an etch rate processing routine to control the actual aspect ratio dependent etch rate, the etch rate processing routine capable of executing the steps of:

retrieving a predetermined etch rate schedule from the memory of the controller, the predetermined etch rate schedule comprising a function of desired aspect ratio dependent etch rate over time;

comparing the actual aspect ratio dependent etch rate to the desired aspect ratio dependent etch rate in the predetermined etch rate schedule that is stored in a memory of the controller; and varying one or more process parameters of the wafer processing system to change the actual aspect ratio dependent etch rate occurring in the chamber to substantially follow the desired aspect ratio dependent etch rate.

18. An apparatus for etching a substrate, the apparatus comprising:

a chamber comprising a pedestal capable of supporting a substrate;

a reactive gas source for delivering a reactive gas to the chamber and an excitation source capable of energizing the reactive gas to etch the substrate;

an interferometer to monitor features being etched in the substrate and generate a signal indicative of an actual aspect ratio dependent etch rate of the features being etched on the substrate; and a controller coupled to the interferometer, the controller comprising a memory and an etch rate processing routine capable of:

receiving the signal from the interferometer;

evaluating the signal to determine the actual aspect ratio dependent etch rate;

during the processing of a first substrate, monitoring the actual aspect ratio dependent etch rate to generate an actual aspect ratio dependent etch rate profile and storing the actual aspect ratio dependent etch rate profile in the memory of the controller;

retrieving a desired aspect ratio dependent etch rate profile from the memory of the controller;

comparing the actual aspect ratio dependent etch rate profile to the desired aspect ratio dependent etch rate profile to generate an etch rate error; and during the processing of a second substrate, varying one or more process parameters of the wafer processing system in relation to the etch rate error.

19. An apparatus for etching a substrate, the apparatus comprising:

a chamber comprising a pedestal capable of supporting a substrate;

a reactive gas source for delivering a reactive gas to the chamber and an excitation source capable of energizing the reactive gas to etch the substrate;

an interferometer to monitor features being etched in the substrate and generate a signal indicative of an actual etch rate of the features being etched on the substrate; and a controller coupled to the interferometer, the controller comprising a memory and an etch rate processing routine capable of:

receiving the signal from the interferometer;

evaluating the signal to determine a rate of change of the actual etch rate;

comparing the rate of change of the actual etch rate to a desirable rate of change of an etch rate; and varying one or more process parameters to change the rate of change of the actual etch rate of the features being etched in the substrate.

20. An apparatus according to claim 19 wherein the controller comprises an etch rate processing routine capable of measuring a rate of change of the actual etch rate that is dependent on the aspect ratio of the features being etched on the substrate.

21. An apparatus according to claim 19 wherein the controller comprises an etch rate processing routine capable of varying one or more process pararmeters to change the rate of change of the actual etch rate to substantially follow the desired rate of change of the etch rate.

* * * * *